(12) United States Patent
Hanna et al.

(10) Patent No.: US 6,783,697 B2
(45) Date of Patent: Aug. 31, 2004

(54) BINDER-LOADED TYPE CHARGE-TRANSPORT LIQUID CRYSTAL MATERIAL

(75) Inventors: Junichi Hanna, Yokohama (JP); Kyoko Kogo, Tokyo-To (JP)

(73) Assignee: Dai Nippon Printing Co., Ltd. (JP)

(*) Notice: Subject to any disclaimer, the term of this patent is extended or adjusted under 35 U.S.C. 154(b) by 0 days.

(21) Appl. No.: 10/370,492

(22) Filed: Feb. 24, 2003

(65) Prior Publication Data

US 2003/0151026 A1 Aug. 14, 2003

Related U.S. Application Data

(63) Continuation of application No. 09/593,136, filed on Jun. 14, 2000, now Pat. No. 6,558,573.

(30) Foreign Application Priority Data

Jun. 14, 1999 (JP) ........................................ 1999-166598

(51) Int. Cl.[7] .......................... C09K 19/58; G03G 5/047
(52) U.S. Cl. ................................ 252/299.3; 252/299.5; 428/1.1; 428/1.4; 430/58.05; 430/59.6; 430/96; 430/20
(58) Field of Search ........................... 252/299.3, 299.5; 428/1.1, 1.4; 430/20, 58.05, 59.6, 59.1, 96

(56) References Cited

U.S. PATENT DOCUMENTS

| 5,030,533 | A | 7/1991 | Bluhm et al. ................ 430/59 |
| 5,766,510 | A | 6/1998 | Hanna et al. ............ 252/299.62 |
| 5,798,197 | A | 8/1998 | Paulus et al. ................ 430/56 |
| 6,218,061 | B1 | 4/2001 | Hanna et al. ............. 430/58.5 |
| 6,224,787 | B1 * | 5/2001 | Hanna et al. ............. 252/299.3 |
| 6,558,573 | B1 * | 5/2003 | Hanna et al. ............. 252/299.3 |
| 6,645,579 | B1 * | 11/2003 | Tsuboyama et al. ......... 428/1.4 |

FOREIGN PATENT DOCUMENTS

| EP | 0742197 A1 | 11/1996 |
| EP | 0860417 A2 | 8/1998 |

OTHER PUBLICATIONS

Database WPI, "Polymer Film Liquid Crystal Electric Charge Transport Material Image . . . ," Derwent Publication Ltd., London, XP002145316, and JP 11172118 (Dainippon Printing Co Ltd), Jun. 29, 1999.

* cited by examiner

Primary Examiner—Shean C. Wu
(74) Attorney, Agent, or Firm—Parkhurst & Wendel, L.L.P.

(57) ABSTRACT

Disclosed is a binder-loaded type charge-transport liquid crystal material which comprises a liquid crystal compound and a binder and, in spite of the presence of the binder, can substantially retain the properties inherent in the liquid crystal compound.

17 Claims, No Drawings

BINDER-LOADED TYPE CHARGE-TRANSPORT LIQUID CRYSTAL MATERIAL

BACKGROUND OF THE INVENTION

1. Field of the Invention

The present invention relates to a binder-loaded type charge-transport liquid crystal material which comprises a liquid crystal compound and a binder and, in spite of the presence of the binder, can retain the properties inherent in the liquid crystal compound, and devices or elements using the same.

2. Background Art

Liquid crystal compounds have various useful properties in addition to an inherent ability to form a liquid crystal, and thus are expected to be utilized in a variety of devices or elements. One of these useful properties is a high level of charge-transport properties to which attention has recently been drawn for utilization as organic semiconductors. Most properties of the liquid crystal compound, however, are deteriorated upon the inclusion of impurities in an amount on the order of ppm. For this reason, combining the liquid crystal compound with other material(s) to prepare a polyfunctional liquid crystal-containing composition has hardly been carried out. For example, an attempt to bring a liquid crystalline charge-transport material to a solid form has resulted in failure due to a rapid deterioration in carrier mobility upon the incorporation of an impurity, such as a binder, into the liquid crystal compound. For this reason, the liquid crystal compound as such should have been sealed into a cell.

SUMMARY OF THE INVENTION

Accordingly, the present invention has been made with a view to solving the problem of the prior art, and it is an object of the present invention to provide a binder-loaded type charge-transport liquid crystal material which comprises a liquid crystal compound and a binder and, in spite of the presence of the binder, can retain the properties inherent in the liquid crystal compound, and devices or elements using the same.

The present inventors have found that a combination of a liquid crystal compound with a specific binder can realize the retention of the properties inherent in the liquid crystal compound in the charge-transport liquid crystal material and, at the same time, can develop the effect of the binder, which has led to the completion of the present invention.

Thus, according to one aspect of the present invention, there is provided a binder-loaded type charge-transport liquid crystal material comprising a liquid crystal compound and a binder, said binder-loaded type charge-transport liquid crystal material substantially retaining properties inherent in the liquid crystal compound.

DESCRIPTION OF THE PREFERRED EMBODIMENTS

Liquid Crystal Compound

Liquid crystal compounds usable in the present invention include, for example, those having charge-transport properties which are expected to be applied to various devices or elements.

Liquid crystal compounds having such charge-transport properties include, but are not particularly limited to, for example, aromatic ring-containing liquid crystal compounds. Specific examples thereof include 2-(4'-pentyloxyphenyl)-6-decyl-oxynaphthalene, 2-(4'-pentyloxyphenyl)-6-octyl-oxynaphthalene, 2-(4'-pentyloxyphenyl)-6-hexyl-oxynaphthalene, and 2-(4'-octyloxyphenyl)-6-dodecyl-oxynaphthalene. The liquid crystal compound according to the present invention is typically one having a smectic phase, but is not limited to this only.

For example, carrier mobility will be discussed among the properties of the liquid crystal compound. The liquid crystalline molecule has a self-aligning property by virtue of the molecular structure. Therefore, unlike the molecule dispersed material, the use thereof as a hopping site inhibits spatial and energetic dispersion of the hopping site and can realize band-like transport properties such as found in molecular crystals. This can offer a feature that larger mobility than that in the conventional molecule dispersed materials can be realized and, in addition, the mobility does not depend upon the electric field.

Liquid crystal compounds, which are preferred in terms of carrier mobility, include those having an electron mobility of not less than $1\times10^{-5}$ cm$^2$/Vs and those having a hole mobility of not less than $1\times10^{-5}$ cm$^2$/Vs. Various devices produced using liquid crystal compounds having such mobility are expected to have quick response.

Binder

According to the present invention, the binder refers to a material, which when incorporated into a liquid crystal compound, can vary, for example, the viscosity, fluidity, or elasticity of the liquid crystal compound. Any binder may be used in the present invention without particular limitation so far as the binder does not substantially vary specific properties of the liquid crystal compound.

Such binders include, for example, various organic polymers. Specific examples thereof include those having an aromatic ring and/or a condensed aromatic ring and/or a heterocyclic aromatic ring on the main chain or side chain thereof. Preferred examples of such binders include those comprising a material(s) selected from the group consisting of polystyrene and derivatives thereof, polynaphthalene and derivatives thereof, polyester resin and derivatives thereof, alkyd resin and derivatives thereof, polycarbonate resin and derivatives thereof, phenolic resin and derivatives thereof, xylene resin and derivatives thereof, epoxy resin and derivatives thereof, urethane resin and derivatives thereof, polyvinylcarbazole and derivatives thereof, polyvinylpyridine and derivatives thereof, amino resin and derivatives thereof, polythiophene and derivatives thereof, urea resin and derivatives thereof, copolymers produced from two or more of monomers constituting said resins, and mixtures of two or more of said materials. More specific examples thereof include polystyrene.

The content of the binder in the binder-loaded type charge-transport liquid crystal material is not particularly limited, and the liquid crystal compound and the binder may be mixed together in any ratio, so far as the properties inherent in the liquid crystal compound are substantially retained. In this case, the amount of the binder is not limited to such an amount that the binder enables the binder-loaded type charge-transfer liquid crystal material to be brought to a solid form or to form a coating, and the amount of the binder may be too small to improve the viscosity. Preferably, however, for example, the use of the binder in an amount of not less than 20% by weight is suitable because the binder-loaded type charge-transfer liquid crystal material can be coated to form a film while retaining the properties of the liquid crystal compound.

Binder-Loaded Type Charge-Transfer Liquid Crystal Material

The binder-loaded type charge-transfer liquid crystal material according to the present invention is preferably such that the liquid crystal compound and the binder can be mutually dissolved (the term "mutually dissolved" as used herein means that the two materials are in the state of dissolution in each other to such an extent that phase separation is not observed at least microscopically). In this connection, it should be noted that the liquid crystal compound and the binder, which are mutually soluble (compatible), are not always required to be mixed together to such an extent that they are mutually dissolved. In short, according to this preferred embodiment, the liquid crystal compound and the binder constituting the charge-transport liquid crystal material are soluble in each other, independently of whether or not the liquid crystal compound and the binder after mixing are in the mutually dissolved state. According to this preferred embodiment, the high level of carrier mobility of the liquid crystal compound can be retained after the incorporation of the binder into the liquid crystal compound.

Among the properties of the binder-loaded type charge-transport liquid crystal material, the carrier mobility is basically the same as that described above in connection with the liquid crystal compound, and is preferably such that the electron mobility is $1 \times 10^{-5}$ to $1$ $cm^2/Vs$ and the hole mobility is $1 \times 10^{-5}$ to $1$ $cm^2/Vs$. In the present specification, "substantially retaining" the properties according to the present invention may also be expressed, for example, such that the liquid crystal compound and the binder-loaded type charge-transfer liquid crystal material meet the same requirement(s) or can be used in the same application using the properties.

Form Of Binder-Loaded Type Charge-Transfer Liquid Crystal Material

The binder-loaded type charge-transfer liquid crystal material according to the present invention may have fluidity. Preferably, however, for example, the binder is added in a large amount to bring the binder-loaded type charge-transfer liquid crystal material to a solid state. The solid is preferably in a coating form.

Devices

The binder-loaded type charge-transfer liquid crystal material according to the present invention may be used in various applications without particular limitation, for example, in driving paths of various devices. Such devices include, for example, image display devices, EL (electroluminescence) devices, photoconductors, space modulating devices, thin-film transistors, and photosensors.

EXAMPLES

The following examples further illustrate the present invention.

Example 1

(Preparation of Liquid Crystal Compound)

In this example, 2-(4'-pentyloxyphenyl)-6-decyl-oxynaphthalene (in the present specification, this liquid crystal compound being hereinafter referred to as "5O-PNP-O10") was used as a liquid crystal compound.

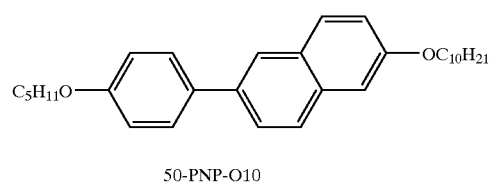

5O-PNP-O10

This 5O-PNP-O10 may be synthesized, for example, through the following reaction path.

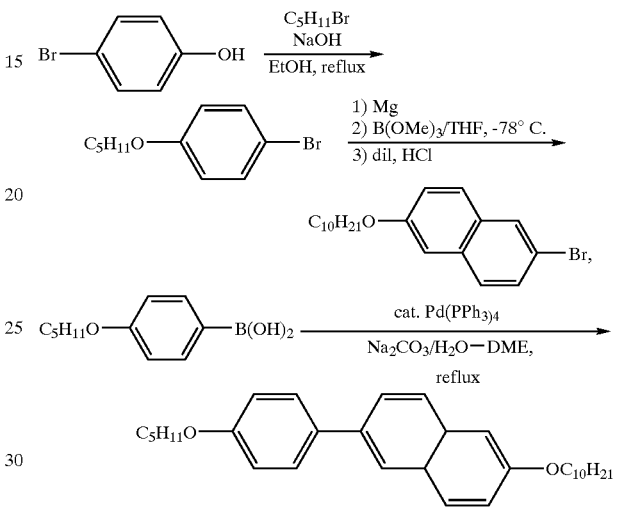

(Temperature Range in Which Liquid Crystal Phase is Observed)

A charge-transport liquid crystal material using 5O-PNP-O10 as a liquid crystal compound and using polystyrene as a binder was cooled at a rate of 0.1° C./min to change the phase from an isotropic phase to a crystal phase. In this case, this change was observed under a polarization microscope to determine a temperature range in which the liquid crystal phase is observed. The results are summarized in the following table.

| Amount of binder added | Temp. of crystal phase-liquid crystal phase | Temp. of liquid crystal phase-isotropic phase |
|---|---|---|
| 0 wt % | 122.6° C. | 150.0° C. |
| 10 wt % | 122.2° C. | 150.1° C. |
| 20 wt % | 121.7° C. | 147.1° C. |

This liquid crystal appeared to be an SmC phase from the state of the texture.

(Mobility Properties)

The waveform of transient photocurrent was measured to examine the mobility properties. Regarding conditions for the measurement, the temperature was once raised to 155° C. to form an isotropic phase, and the temperature was then decreased from 145° C. to 130° C. in 2.5° C. increment. The voltage was changed from 100 V to 40 V in 10 V increment. The resultant temperature and electric field-mobility properties are summarized in the following table.

Results of experiment wherein polystyrene was not loaded:

TABLE 1

Temp. and electric field-mobility properties [$10^{-4}$ cm$^2$/Vs]
(polystyrene not loaded, positive bias)

| Temp., °C. | 100 V | 90 V | 80 V | 70 V | 60 V | 50 V | 40 V |
|---|---|---|---|---|---|---|---|
| 145.0 | 4.18 | 3.96 | 4.03 | 4.10 | 4.27 | 4.39 | 4.77 |
| 142.5 | 4.01 | 3.97 | 3.83 | 3.80 | 4.11 | 4.12 | 4.42 |
| 140.0 | 3.91 | 3.87 | 3.88 | 4.04 | 3.93 | 4.34 | 4.41 |
| 137.5 | 3.76 | 3.77 | 3.83 | 3.75 | 3.85 | 3.87 | 4.41 |
| 135.0 | 3.62 | 3.72 | 3.69 | 3.90 | 3.77 | 3.91 | 4.25 |
| 132.5 | 3.62 | 3.68 | 3.60 | 3.85 | 3.66 | 3.72 | 4.15 |
| 130.0 | 3.57 | 3.58 | 3.55 | 3.66 | 3.57 | 3.72 | 4.09 |
| 127.5 | 3.48 | 3.36 | 3.50 | 3.39 | 3.47 | 3.58 | 3.88 |
| 125.0 | 3.53 | 3.40 | 3.50 | 3.52 | 3.39 | 3.49 | 3.84 |

TABLE 2

Temp. and electric field-mobility properties [$10^{-4}$ cm$^2$/Vs]
(polystyrene not loaded, reverse bias)

| Temp., °C. | 100 V | 90 V | 80 V | 70 V | 60 V | 50 V | 40 V |
|---|---|---|---|---|---|---|---|
| 142.5 | 4.27 | 4.24 | 4.23 | 4.24 | 4.25 | 4.23 | 4.26 |
| 140.0 | 4.15 | 4.13 | 4.12 | 4.15 | 4.12 | 4.12 | 4.16 |
| 137.5 | 4.01 | 4.03 | 4.01 | 4.01 | 4.02 | 4.01 | 4.04 |
| 135.0 | 3.88 | 3.90 | 3.88 | 3.90 | 3.91 | 3.89 | 3.92 |
| 132.5 | 3.75 | 3.77 | 3.75 | 3.74 | 3.78 | 3.74 | 3.77 |
| 130.0 | 3.62 | 3.65 | 3.65 | 3.68 | 3.67 | 3.69 | 3.67 |

Results of experiment wherein 10 wt % polystyrene was loaded:

TABLE 3

Temp. and electric field-mobility properties [$10^{-4}$ cm$^2$/Vs]
(10 wt % polystyrene loaded, positive bias)

| Temp., °C. | 100 V | 90 V | 80 V | 70 V | 60 V | 50 V | 40 V |
|---|---|---|---|---|---|---|---|
| 142.5 | 4.05 | 4.05 | 4.04 | 4.05 | 4.07 | 4.07 | 4.08 |
| 140.0 | 3.99 | 4.01 | 3.97 | 3.99 | 3.95 | 3.97 | 3.95 |
| 137.5 | 3.93 | 3.94 | 3.94 | 3.93 | 3.93 | 3.93 | 3.94 |
| 135.0 | 3.89 | 3.87 | 3.86 | 3.85 | 3.92 | 3.88 | 3.91 |
| 132.5 | 3.82 | 3.81 | 3.81 | 3.82 | 3.83 | 3.82 | 3.84 |
| 130.0 | 3.74 | 3.75 | 3.77 | 3.75 | 3.74 | 3.74 | 3.77 |
| 127.5 | 3.71 | 3.70 | 3.72 | 3.71 | 3.71 | 3.72 | 3.74 |

TABLE 4

Temp. and electric field-mobility properties [$10^{-4}$ cm$^2$/Vs]
(10 wt % polystyrene loaded, reverse bias)

| Temp., °C. | 100 V | 90 V | 80 V | 70 V | 60 V | 50 V | 40 V |
|---|---|---|---|---|---|---|---|
| 142.5 | 4.07 | 4.08 | 4.07 | 4.09 | 4.09 | 4.07 | 4.11 |
| 140.0 | 4.01 | 4.03 | 4.02 | 4.03 | 4.02 | 4.04 | 4.05 |
| 137.5 | 3.96 | 3.94 | 3.96 | 3.97 | 3.95 | 3.93 | 3.98 |
| 135.0 | 3.91 | 3.87 | 3.89 | 3.90 | 3.91 | 3.90 | 3.93 |
| 132.5 | 3.84 | 3.83 | 3.83 | 3.85 | 3.82 | 3.84 | 3.87 |
| 130.0 | 3.77 | 3.79 | 3.79 | 3.78 | 3.79 | 3.79 | 3.80 |
| 127.5 | 3.72 | 3.73 | 3.72 | 3.70 | 3.72 | 3.72 | 3.75 |

Results of experiment wherein 20 wt % polystyrene was loaded:

TABLE 5

Temp. and electric field-mobility properties [$10^{-4}$ cm$^2$/Vs]
(20 wt % polystyrene loaded, positive bias)

| Temp., °C. | 100 V | 90 V | 80 V | 70 V | 60 V | 50 V | 40 V |
|---|---|---|---|---|---|---|---|
| 140.0 | 3.86 | 4.00 | 4.03 | 4.01 | 4.06 | 4.07 | 4.03 |
| 137.5 | 3.89 | 3.94 | 4.05 | 3.96 | 4.01 | 4.04 | 4.06 |
| 135.0 | 3.82 | 3.86 | 3.83 | 3.87 | 3.84 | 3.94 | 3.95 |
| 132.5 | 3.79 | 3.77 | 3.86 | 3.88 | 3.88 | 3.91 | 3.87 |
| 130.0 | 3.71 | 3.81 | 3.89 | 3.83 | 3.80 | 3.90 | 3.93 |
| 127.5 | 3.72 | 3.75 | 3.77 | 3.76 | 3.75 | 3.75 | 3.76 |
| 125.0 | 3.67 | 3.67 | 3.73 | 3.75 | 3.76 | 3.75 | 3.72 |

TABLE 6

Temp. and electric field-mobility properties [$10^{-4}$ cm$^2$/Vs]
(20 wt % polystyrene loaded, reverse bias)

| Temp., °C. | 100 V | 90 V | 80 V | 70 V | 60 V | 50 V | 40 V |
|---|---|---|---|---|---|---|---|
| 140.0 | 3.91 | 3.93 | 4.00 | 3.95 | 4.01 | 3.95 | 4.05 |
| 137.5 | 3.87 | 3.92 | 3.91 | 3.92 | 3.92 | 3.90 | 4.01 |
| 135.0 | 3.82 | 3.84 | 3.84 | 3.86 | 3.84 | 3.87 | 3.92 |
| 132.5 | 3.76 | 3.74 | 3.78 | 3.80 | 3.81 | 3.85 | 3.88 |
| 130.0 | 3.74 | 3.71 | 3.75 | 3.75 | 3.77 | 3.78 | 3.78 |
| 127.5 | 3.70 | 3.70 | 3.72 | 3.72 | 3.73 | 3.75 | 3.73 |
| 125.0 | 3.63 | 3.68 | 3.69 | 3.67 | 3.70 | 3.68 | 3.64 |

The above results show that the mobility of the charge-transfer liquid crystal material with a polystyrene loading level of 20% by weight substantially remained unchanged as compared with the mobility of the liquid crystal compound per se.

Further, as is apparent from the tables, the mobility substantially remained unchanged upon a change in temperature and a change in applied voltage, and the mobility of the liquid crystal compound per se could be retained in the charge-transfer liquid crystal material.

Example 2

A test was carried out in the same manner as in Example 1, except that 2-(4'-octyloxyphenyl)-6-dodecyl-oxynaphthalene was used as the liquid crystal compound. As a result, polystyrene loading on a level of 30% by weight did not substantially lower the mobility. Further, as with Example 1, the mobility substantially remained unchanged upon a change in temperature and a change in applied voltage.

As is apparent from the foregoing description, the present invention can provide a binder-loaded type charge-transport liquid crystal material which comprises a liquid crystal compound and a binder and, in spite of the presence of the binder, can retain the properties inherent in the liquid crystal compound. In particular, according to a preferred embodiment of the present invention, the liquid crystal compound can be advantageously coated to form a film while retaining the high level of carrier mobility.

Thus, according to the charge-transport liquid crystal material of the present invention, the loading of a specific binder does not substantially vary and can realize the retention of the properties inherent in the liquid crystal compound. This can eliminate the need to use a cell structure, which has hitherto been indispensable in use of liquid crystal materials, and can realize film formation of liquid crystal materials without deteriorating the properties inherent in liquid crystal compounds. Therefore, the charge-transport liquid crystal material can realize the development of applications thereof particularly into EL devices, photoreceptors for electrophotography and the like.

What is claimed is:

1. A binder-loaded type charge-transport liquid crystal material comprising
   a liquid crystal compound having a smectic phase; and
   a binder containing in its main or side chain an aromatic ring and/or a condensed aromatic ring and/or a heterocyclic aromatic ring,
   said binder-loaded type charge-transport liquid crystal material substantially retaining a carrier mobility of $1 \times 10^{-5}$ to 1 cm$^2$/Vs.

2. The binder-loaded type charge-transport liquid crystal material according to claim 1, wherein the liquid crystal compound and the binder are mutually soluble.

3. The binder-loaded type charge-transport liquid crystal material according to claim 1, wherein the liquid crystal compound and the binder have been dissolved in each other.

4. The binder-loaded type charge-transport liquid crystal material according to claim 1, wherein the liquid crystal compound also substantially retains charge transport properties in a smectic liquid crystal phase.

5. The binder-loaded type charge-transport liquid crystal material according to claim 1, wherein the binder comprises a material selected from the group consisting of polystyrene and derivatives thereof, polynaphthalene and derivatives thereof, polyester resin and derivatives thereof, alkyd resin and derivatives thereof, polycarbonate resin and derivatives thereof, phenolic resin and derivatives thereof, xylene resin and derivatives thereof, epoxy resin and derivatives thereof, urethane resin and derivatives thereof, polyvinylcarbazole and derivatives thereof, polyvinylpyridine and derivatives thereof, amino resin and derivatives thereof, polythiophene and derivatives thereof, urea resin and derivatives thereof, copolymers produced from two or more of monomers constituting said resins, and mixtures of two or more of said materials.

6. A coating comprising the binder-loaded type charge-transport liquid crystal material according to claim 1.

7. An image display device comprising in its driving path the binder-loaded type charge-transport liquid crystal material according to claim 1.

8. An EL (electroluminescence) device comprising in its driving path the binder-loaded type charge-transport liquid crystal material according to claim 1.

9. A photoconductor comprising in its driving path the binder-loaded type charge-transport liquid crystal material according to claim 1.

10. A space modulating device comprising in its driving path the binder-loaded type charge-transport liquid crystal material according to claim 1.

11. A thin-film transistor comprising in its driving path the binder-loaded type charge-transport liquid crystal material according to claim 1.

12. A photosensor comprising in its driving path the binder-loaded type charge-transport liquid crystal material according to claim 1.

13. The binder-loaded type charge-transport liquid crystal material according to claim 1, wherein the binder is present in an amount not lees than 20% by weight of the liquid crystal material.

14. The binder-loaded type charge-transport liquid crystal according to claim 1, wherein the binder comprises polystyrene or a derivative thereof.

15. The binder-loaded type charge-transport liquid crystal according to claim 2, wherein the binder comprises polystyrene or a derivative thereof.

16. The binder-loaded type charge-transport liquid crystal according to claim 3, wherein the binder comprises polystyrene or a derivative thereof.

17. The binder-loaded type charge-transport liquid crystal according to claim 4, wherein the binder comprises polystyrene or a derivative thereof.

* * * * *